United States Patent

Billenstein et al.

[11] Patent Number: 5,885,118
[45] Date of Patent: Mar. 23, 1999

[54] CONTACT SPRING STRIP FOR PLUGGING ONTO HOLDING STRIPS, IN PARTICULAR AT THE FRONT PANEL OF MODULES IN SHIELDED MODULE CARRIERS

[75] Inventors: Ernst Billenstein, Burgbernheim; Werner Körber, Betzenstein; Siegfried Kurrer, Nürnberg; Kurt-Michael Schaffer, Eckental, all of Germany

[73] Assignee: Siemens Aktiengesellschaft, München, Germany

[21] Appl. No.: 930,311

[22] PCT Filed: Aug. 16, 1995

[86] PCT No.: PCT/DE95/01077

§ 371 Date: Mar. 26, 1998

§ 102(e) Date: Mar. 26, 1998

[87] PCT Pub. No.: WO96/39017

PCT Pub. Date: Dec. 5, 1996

[30] Foreign Application Priority Data

Jun. 1, 1995 [DE] Germany .................. 295 09 102 U

[51] Int. Cl.[6] .................................................. H01R 4/48
[52] U.S. Cl. ................................... 439/862; 361/818
[58] Field of Search .............................. 439/108, 607, 439/609; 361/818, 800, 825, 816

[56] References Cited

U.S. PATENT DOCUMENTS

| | | | |
|---|---|---|---|
| 2,065,651 | 12/1936 | Burton | 250/16 |
| 5,233,507 | 8/1993 | Gunther et al. | 439/108 |

FOREIGN PATENT DOCUMENTS

| | | |
|---|---|---|
| 207 226 | 1/1987 | European Pat. Off. . |
| 456 858 | 11/1991 | European Pat. Off. . |
| 35 23 770 | 8/1987 | Germany . |
| 88 15 986.8 | 5/1990 | Germany . |
| 43 07 806 | 4/1991 | Germany . |
| 91 04 234.8 | 7/1991 | Germany . |
| 41 10 800 | 7/1992 | Germany . |
| 43 11 246 | 3/1994 | Germany . |

*Primary Examiner*—Neil Abrams
*Assistant Examiner*—Javaid Nasri
*Attorney, Agent, or Firm*—Kenyon & Kenyon

[57] ABSTRACT

A contact spring strip including a plurality of contact springs (F) held together in a chain-like manner. Each contact spring (F) includes a hat region (H). The hat region (H) when in the plugged-on state of the contact spring strip grips the head region (HK) of the retaining strip (HS). Each contact spring (F) also includes a spring leaf (FB) which, starting from the hat region (H) on the front (HA) of the retaining strip (HS) is spread away outwards at a bending edge (K). In addition, each contact spring (F) includes two latching claws (RK1 and RK2) which, starting from the hat region (H), are cut free at the front (HA) of the retaining strip (HS) at the bending edge (K) in a spread away outwards manner and situated on both sides next to the spring leaf (FB), and which respectively have a retaining lug (RF1 and RF2) which is spread away upwards in the direction of the head region (HK) and the front (HA) of the retaining strip (HS) and has a latching edge (RA1 and RA2). Further, each contact spring (F) includes a retaining leaf (HB) which, starting from the hat region (H), reaches onto the rear (HI) of the retaining strip (HS) and from which at least one retaining lug (RB) is cut out and spread away in the direction of the rear (HI).

12 Claims, 5 Drawing Sheets

CONTACT SPRING STRIP FOR PLUGGING ONTO HOLDING STRIPS, IN PARTICULAR AT THE FRONT PANEL OF MODULES IN SHIELDED MODULE CARRIERS

BACKGROUND INFORMATION

German Patent No. 41 10 800 describes a module for insertion into HF-proof housings of electronic equipment. The module has a front plate constructed in a "U" shape profile. A spring strip including a plurality of spring elements following one another in a chain-like manner is provided for the purpose of high-frequency sealing of the longitudinal gaps between the front plates of modules arranged parallel to one another, for example in a subrack. The spring strip is plugged onto the longitudinal web forming one side of the U-shaped profile of the front plate of a module, and makes contact electro-magnetically and in a radio-frequency-proof fashion between the front plate and the opposite longitudinal strip forming the other side of the U-shaped profile of the front plate of a neighboring module.

A spring element of the spring strip includes two identically constructed contact springs each having a spring leaf and, arranged between a spring clamp and a clamping leaf. The contact springs and the spring clamp have a common, flat rear leaf. The spring clamp and rear leaf are constructed with a U-shaped cross-section and can be plugged onto the longitudinal web of the front plate in a clamping fashion such that the rear leaf rests on the inside of the longitudinal web. The contact springs and rear leaf have a V-shaped cross-section, with the result that their spring leaves are spread away by the outside of the longitudinal web.

One problem in this arrangement is that a proper and sufficient clamping action requires that the cooperating elements of spring clamp and rear leaf and the longitudinal web onto which these elements are plugged are of sufficient height. The essential cause of the latter is that the retaining action is achieved overwhelmingly through the use of friction forces. A further problem is that the element of the spring clamp must furthermore be of sufficient width on the front of the spring element to achieve the required clamping action. The effect of this is that the spacing between the contact springs arranged on both sides of the spring clamp is relatively large. To achieve continuous contact and thus a sufficient screening action, it is necessary for the spring leaves to be connected to one another by a connecting bridge in the lower region. Since, however, the high spring clamp situated between the connecting bridge can be constructed only to be narrow and like a web, the risk of mechanical damage to it is high.

SUMMARY OF THE INVENTION

An object of the present invention is to provide a contact spring strip which overcomes the disadvantages of known devices.

The aforementioned object is achieved using a contact spring strip, made from a multiplicity of contact springs held together in a chain-like manner, for plugging onto a retaining strip, in particular on the front plate of a printed circuit board, each contact spring containing a hat region which, in the plugged-on state of the contact spring strip grips the head region of the retaining strip, a spring leaf which, starting from the hat region on the front of the retaining strip is spread away outwards at a bending edge, two latching claws which, starting from the hat region, are cut free at the front of the retaining strip at the bending edge in a spread away outwards manner and situated on both sides next to the spring leaf, and which respectively have a retaining lug which is spread away upwards in the direction of the head region and the front of the retaining strip and has a latching edge, and a retaining leaf which, starting from the hat region, reaches onto the rear of the retaining strip and from which at least one retaining lug is cut out and spread away in the direction of the rear of the retaining strip.

1DETAILED DESCRIPTION OF THE INVENTION

Figure 1:
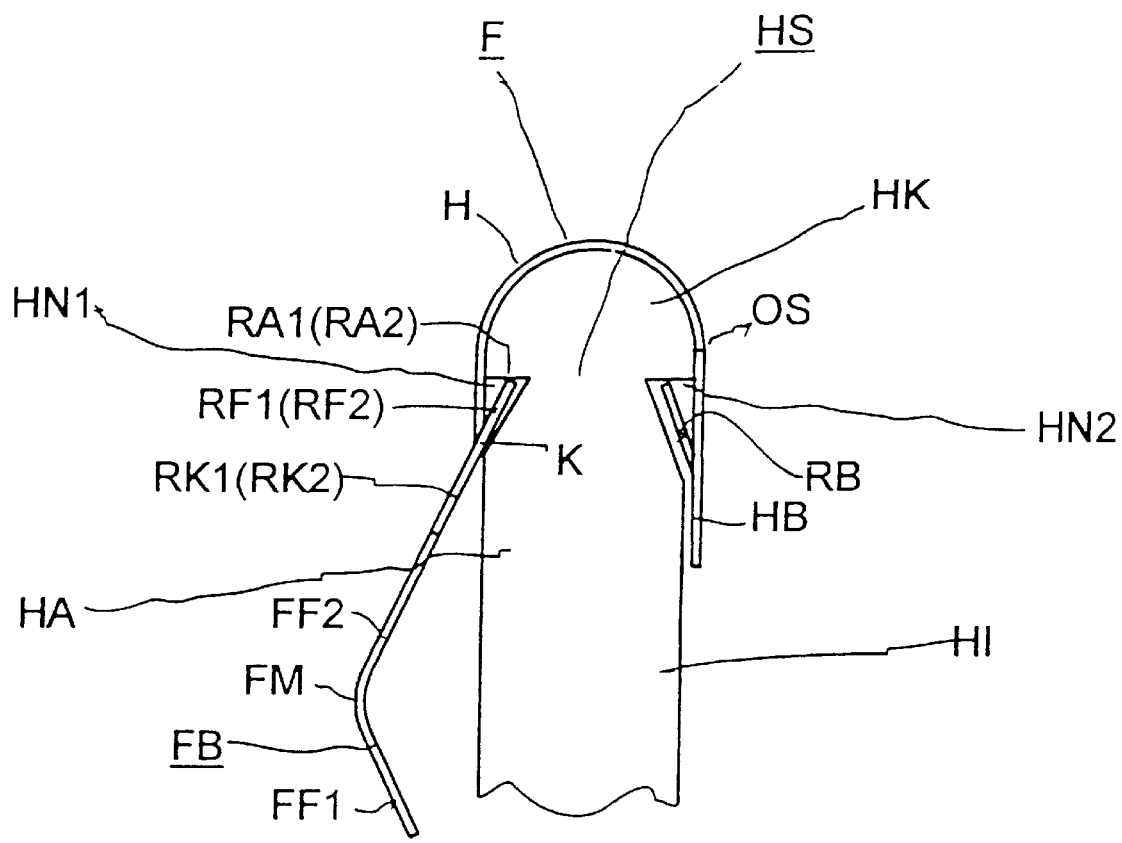
FIG. 1 shows a sectional representation through a first exemplary embodiment of a contact spring strip latched onto a retaining strip according to the present invention.

Shown in the sectional representation in FIG. 1 is the upper region of a retaining strip HS which serves as carrier for a latched-on contact spring strip in accordance with the present invention. The retaining strip has a front HA and a rear HI. The spring leaves FB of the contact springs F of the contact spring strip come to lie on the front HA, which serves as a contact region, while the rear HI serves as an abutment for retaining the contact spring.

A hat region H of the contact spring F comprises the head region HK of the retaining strip HS and rests there as far as possible in a self-closed fashion. In the example shown in FIG. 1, the head region HK is rounded off, so that for this design the hat region, which is matched by shape, as a cross-section is in the shape of an inverted U or a groove. In the case of another design (not shown), it is also possible for the head region HK to be of rectangular and angular configuration, so that the hat region H of the contact spring strip is then in the shape of an inverted shaft.

According to the present invention, a spring leaf FB, via which in the case of contact with components situated opposite (not shown in FIG. 1) electrically conductive contact is made, is spread away outwards from the hat region H starting from a bending edge. The spring leaf FB of the contact spring preferably has a roof-shaped cross-section. The result in this case is a spring flank FF2 which extends from the bending edge K up to a spring middle FM projecting furthest from the front HA of the retaining strip HS. Moreover, there is produced subsequent thereto a further spring flank FF1 which, starting from the spring middle FM, extends again in a fashion directed towards the front HA.

The contact spring in accordance with the present invention further has two latching claws RK1 and RK2 which, starting from the hat region H, are cut free at the front HA of the retaining strip HS at the bending edge K in approximately the same way as the spring leaf FB and in a manner spread away outwards and situated on both sides next to the spring leaf FB. In the lateral cross-sectional representation of FIG. 1, the front latching claw RK1 is shown, while the other latching claw RK2 lies in the plane of the drawing and cannot be seen. According to the present invention, each latching claw RK1 and RK2 has a retaining lug RF1 and RF2 which is spread away upwards in the direction of the head region HK and the front HA of the retaining strip HS and ends at the very top in a latching edge RA1 and RA2. In the plugged-on state of the contact spring F, the retaining lugs RF1 and RF2 can, in accordance with the representation in FIG. 1, advantageously engage in a first latching groove HN1 which is inserted into the retaining strip HS on the front HA approximately below the head region HK, and the retaining lugs are supported therein via the latching edges RA1 and RA2.

In accordance with another exemplary embodiment (not shown), it is also possible to dispense with a latching groove in the retaining strip HS, with the result that the latching edges RA1 and RA2 engage in a clamping fashion and, in some circumstances, also in a cutting fashion up to a certain degree, directly on the surface of the front HA of the retaining strip HS.

Finally, the contact spring F according to the present invention has a retaining leaf HB which, starting from the hat region H, reaches onto the rear HI of the retaining strip HS, and from which at least one retaining lug RB is cut out and spread away in the direction of the rear HI of the retaining strip HS. The latter preferably engages in a second latching groove HN2, which on the rear HI is advantageously likewise inserted into the retaining strip HS approximately below the head region HK.

Here, as well, in accordance with another exemplary embodiment (not shown) it is possible to dispense with a latching groove in the retaining strip HS, with the result that the retaining lug engages in a clamping fashion and, in some circumstances, also in a cutting fashion up to a certain degree, directly on the surface of the rear HI of the retaining strip HS. The contact spring is thus pushed onto a retaining strip which has a flat front and a flat rear which are not interrupted by grooves and the like.

The design according to the present invention has the particular advantage that the latching of the contact spring F with the retaining strip HS is performed approximately below the head region HK of the retaining strip, with the result that the retaining strip HS itself need not have a great height per se. The spread away spring leaf FB of the contact spring is therefore completely decoupled from the retaining latching claws RK1 and RK2.

Figure 2:
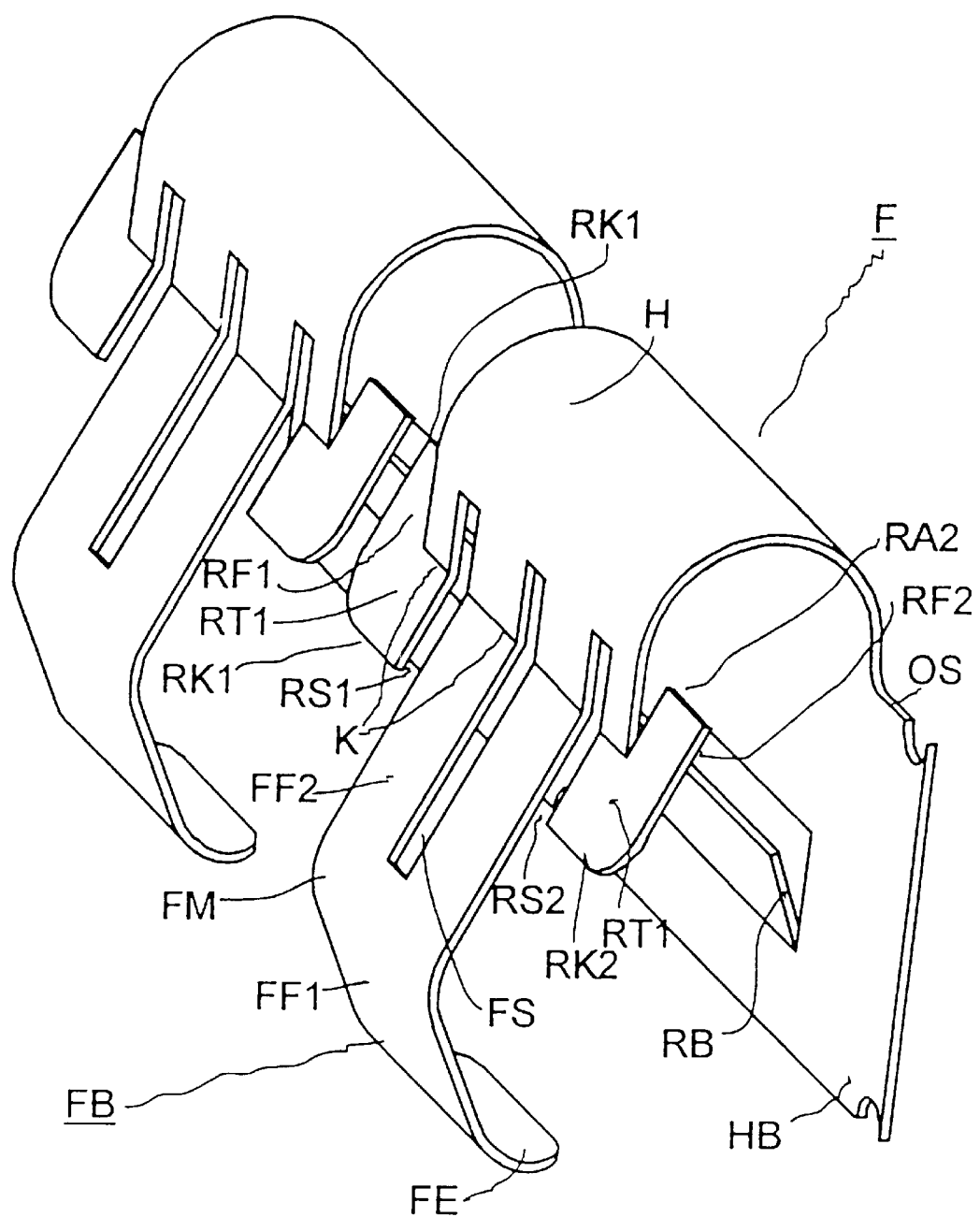
FIG. 2 shows a perspective view of the front of two contact springs held together in a chain-like manner in accordance with a second exemplary embodiment.

An advantage of this exemplary embodiment is apparent in FIG. 2, which shows a perspective top view of the front of two contact springs F held together in a chain-like manner. A plurality of such contact springs can be connected to form a contact spring strip.

The contact spring FE is cut free from the neighboring latching claws RK1 and RK2 on both sides via in each case one free cut or slit RS1 and RS2. Each of the two latching claws has in each case one bearing surface RT1 and RT2 which, like the spring leaf FM situated therebetween, are spread away forwards at the bending edge K of the hat region H in a fashion which is favorable in terms of production engineering. As a result, the lug-shaped extensions RF1 and RF2, which run away backwards above the bending edge K and are known as retaining lugs, are conversely spread away in the direction of the front of the retaining strip and can, via their latching edges RA1 and RA2 at the upper ends of the latching lugs RF1 and RF2, latch in an optimal manner into a corresponding latching groove of the retaining strip. Owing to the configuration according to the present invention, the spring leaf FE and the latching claws RK1 and RK2 on either side are thus decoupled from one another optimally in functional terms. It is advantageously possible for this purpose to extend the free cuts RS1 and RS2 upwards beyond the bending edge K as far as into the hat region H.

In the design represented in FIG. 2, the retaining leaf HE resting on the rear of the retaining strip is lengthened. The at least one retaining lug RB cut free then comes to lie more in the lower region of the retaining leaf HE. As a result, the retention of the contact spring F can be improved on the retaining strip, in particular in the case of the occurrence of particularly strong shearing, deforming and friction forces, particularly such forces acting on the middle FM of the spring.

Figure 3:
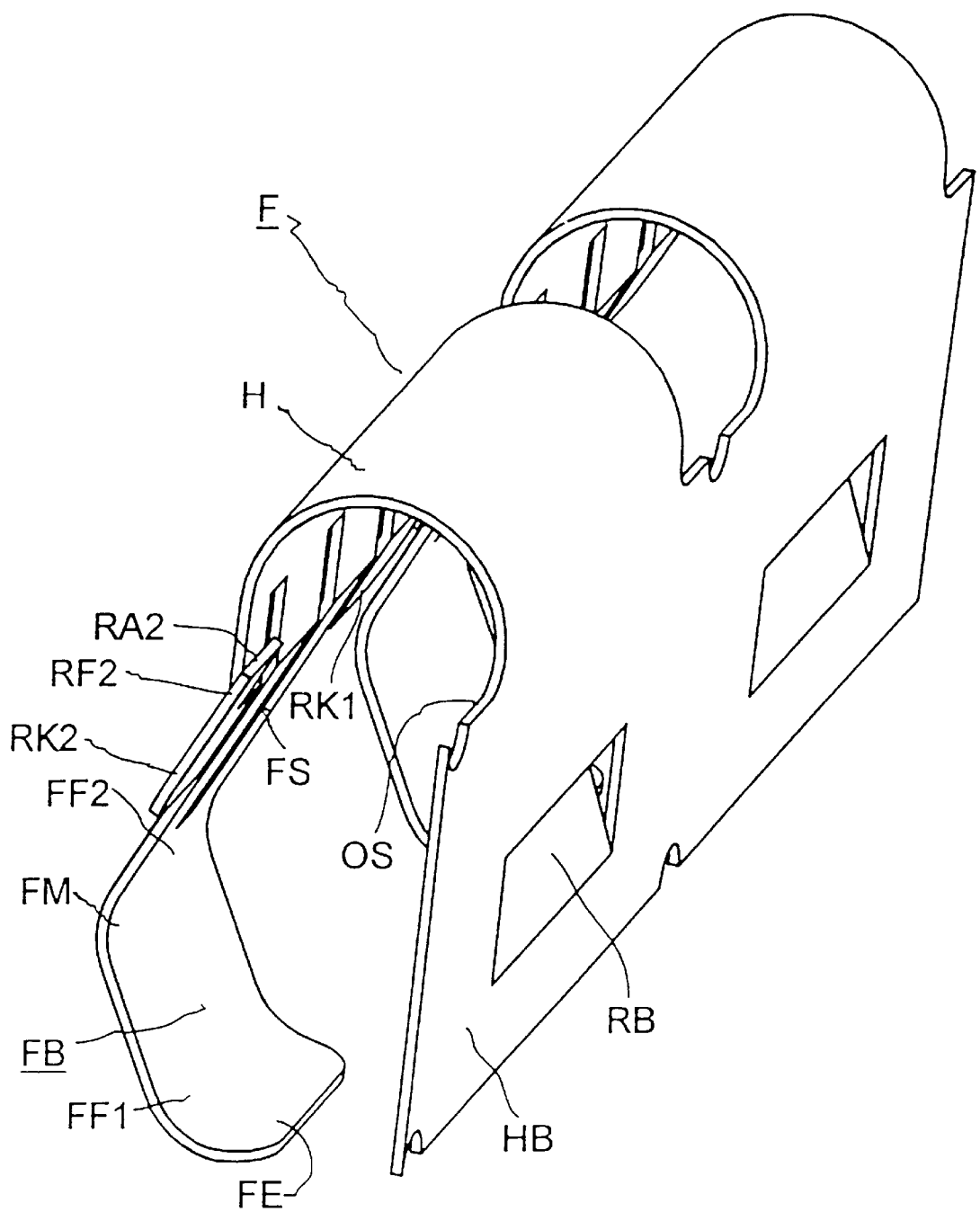
FIG. 3 shows a perspective view of the rear of the two contact springs held together in a chain-like manner, in accordance with FIG. 2.

In accordance with a further design, shown in FIGS. 2 and 3, the spring leaf FE itself has a longitudinal slit FS. As a result, the spring becomes "softer" and can more easily be deformed elastically by virtue of compressive and friction forces, impinging in an obliquely tangential fashion, in particular on the second spring flank FF2, during the contacting operation with contact surfaces which are situated opposite and are preferably a component of the side of a neighboring front plate of a further module.

The lower, first spring flank FF1, which is averted from the acting forces and extends from the middle FM of the spring up to the spring end FE, is advantageously filled solid. As a result, the first spring flank has a sufficient inner stiffness against twisting. It is advantageous for the longitudinal slit FS to extend only along the second spring flank FF2, i.e., at least approximately from the middle FM of the spring up to the bending line. Consequently, the only spring flank which becomes "softer" is that which is exposed to particularly strong deformations during a contacting operation. If, in accordance with the representation in FIG. 2, the longitudinal slit FS reaches upwards in a preferred fashion beyond the bending line K as far as into the hat region H, the non-destructive deformability of the contact spring F is further promoted. In general, the spring characteristic of the spring leaf FB can be adjusted by appropriate selection of the width of the longitudinal slit FS and of the widths of the two webs of the spring leaf, which reach on the right up to the free slit RS1 and on the left up to the free slit RS2.

Figure 4:
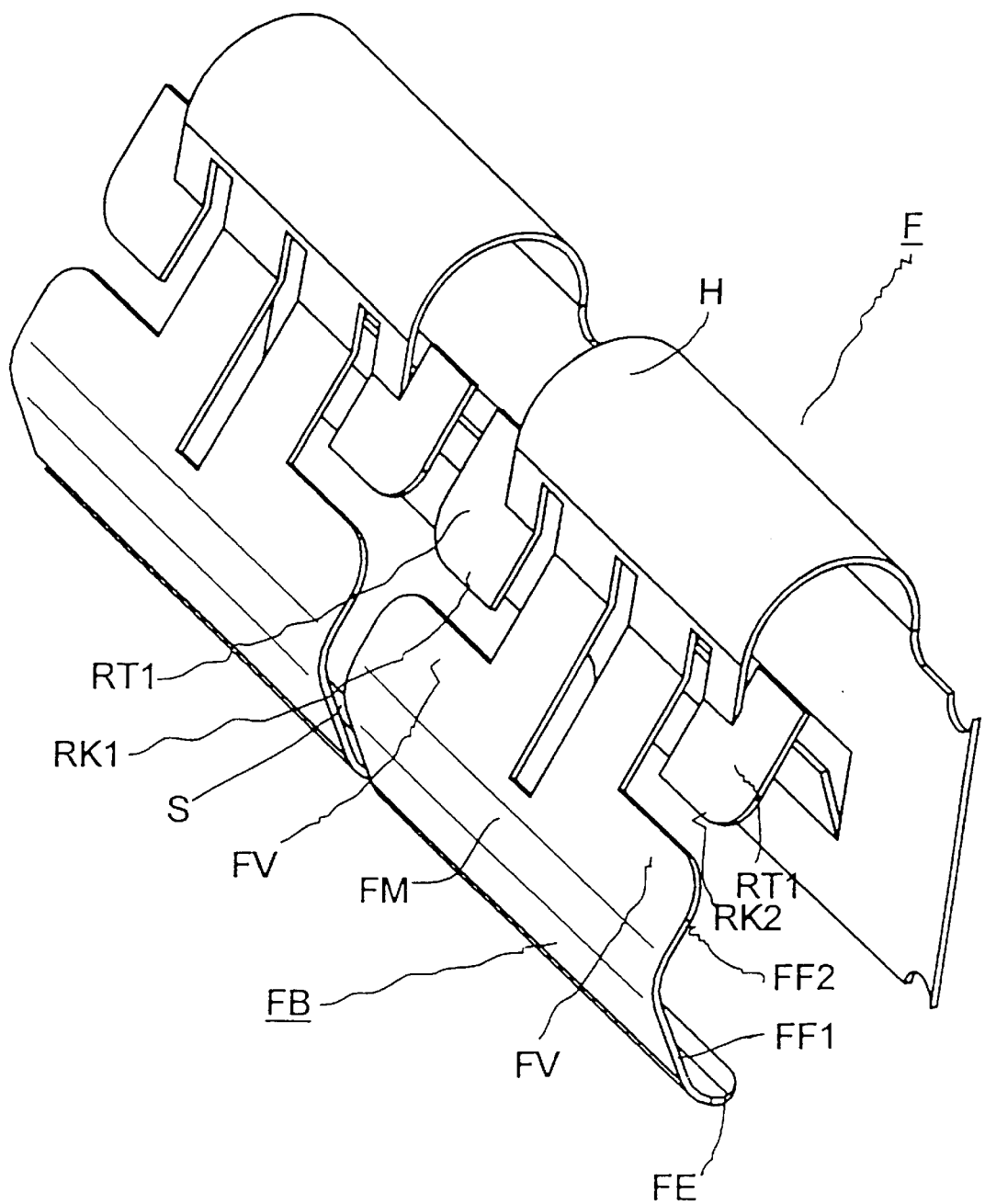
FIG. 4 shows a perspective view of the front of two contact springs held together in a chain-like manner corresponding to the exemplary embodiment shown in FIG. 2 but have spring leaves which are widened like beaver tails.

FIG. 4 shows a further, perspective side view of the front of, for example, two contact springs held together in a chain-like manner. Although these contact springs essentially correspond to the exemplary embodiment shown in FIG. 2, they have spring leaves which are widened like a beaver tail. Thus, the area of the spring leaf FB is enlarged both on the left-hand and on the right-hand side by widened portions FV so that the spring leaves of neighboring contact springs are separated from one another only via a narrow gap S. As already shown in FIG. 4, the widths of the widened portions FV correspond in a particularly favourable fashion approximately to the widths of the latching claws RK1 and RK2 situated thereover in the direction of the hat region H. By comparison with the exemplary embodiment of FIG. 2, in the exemplary embodiment of FIG. 4 on both sides of the middle FM of the spring of a spring leaf FB the regions of the first and second spring flanks FF1 and FF2 are thus respectively lengthened in the direction of the extension of a contact spring strip including a plurality of contact springs F held together in a chain-like manner. The middles FM of the springs of such contact springs combined to form a contact spring strip thus form a virtually continuous bearing region for opposite components, in particular of neighboring printed circuit boards, and are thus separated from one another only by the narrow gap S.

The spring end FE preferably forms a bend in the spring leaf FB which is directed sharply inwards. This is advantageous, in particular, when the contact spring according to the present invention or a contact spring strip formed therefrom is latched onto a retaining strip which represents a side part of the front plate of a printed circuit board. Such a use is shown in the exemplary embodiment of FIG. 5. In the case of printed circuit boards, it has to be taken into account that the boards are relatively frequently removed from a subrack and reinserted. It is therefore possible for strong deforming forces to act repeatedly in an oblique tangential direction from below onto the second spring flank F1 as well. It is advantageous for the purpose of avoiding irreversible deformations and, as the case may be, even jamming for the lower spring end FE to be bent away sharply inwards.

Figure 5:
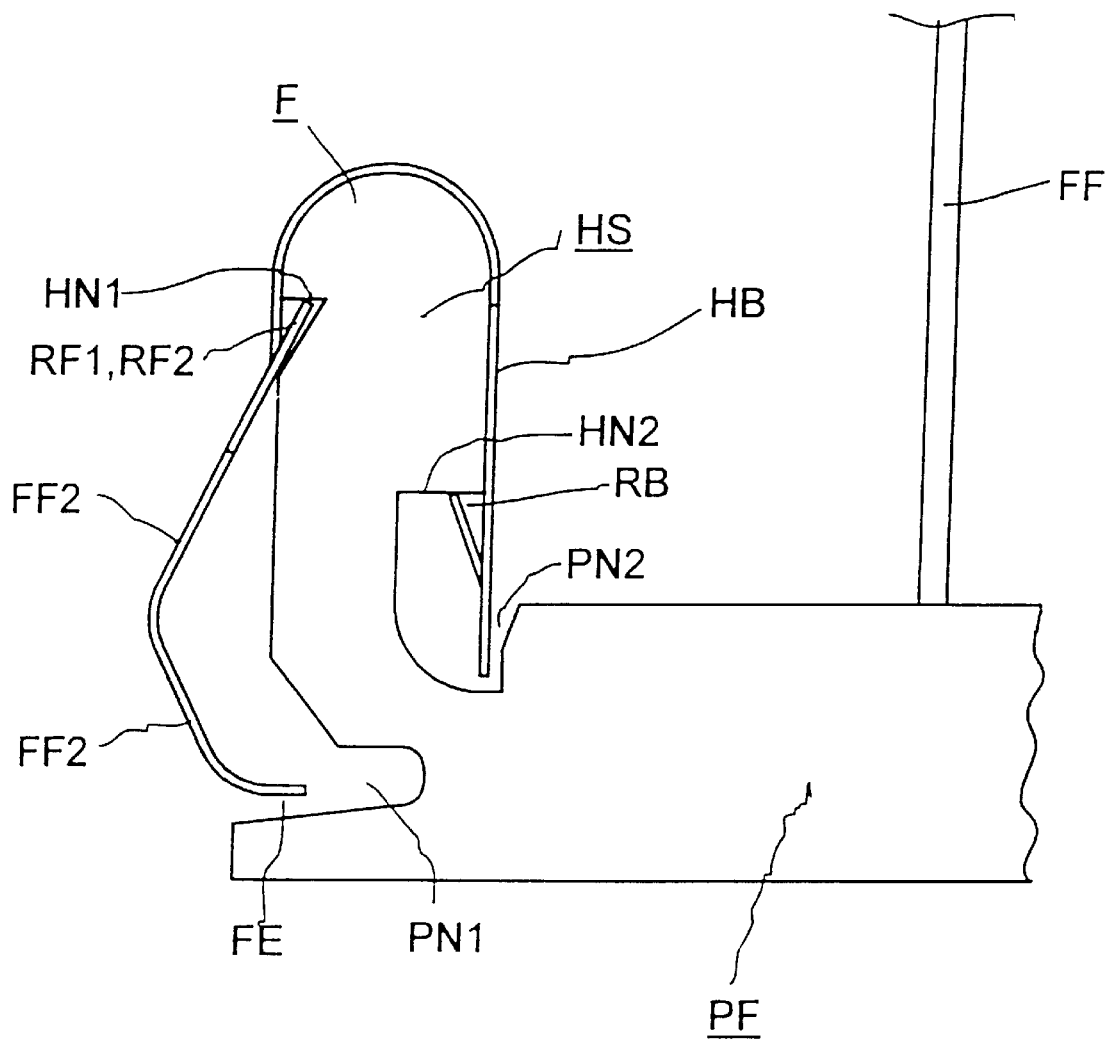
FIG. 5 shows a sectional representation corresponding to the exemplary embodiment of FIGS. 2, 3 and 4, of a contact spring strip in accordance with the present invention which is latched onto a lateral web of the front plate of a printed circuit board.

FIG. 5 shows the left-hand end of the front plate PF of a printed circuit board FF. Extending parallel to the printed circuit board is a retaining strip HS onto which a contact spring F configured in accordance with the present invention is latched. By virtue of the latching of the contact spring at least with the front of the retaining strip HS in the head region thereof both the supporting retaining strip and the contact spring need have only a low overall height. It is advantageous for the front plate PF in FIG. 5 to have on the side a first engaging groove PN1 into which the spring end FE of the contact spring F can dip. A second engaging groove PN2 is advantageously present in the shoulder region between the inside of the front plate PF and the rear of the retaining strip HS. On the one hand, the second engaging groove can take over the function of the latching groove HN2 to accommodate the retaining lug RB. On the other hand, the lower end of a downwardly lengthened retaining leaf HB can be laterally supported therein.

What is claimed is:

1. A contact spring strip, comprising:
    a plurality of contact springs, wherein the plurality of contact springs are held together in a chain-like manner, wherein the plurality of contact springs are used for plugging onto a retaining strip, and wherein each contact spring of the plurality of contact springs includes:
        a hat region for gripping a head region of the retaining strip,
        a spring leaf, wherein the spring leaf starting from a bending edge of the hat region on a front of the retaining strip is spread away outwards,
        two latching claws, wherein the two latching claws starting from the hat region are cut free at the bending edge in a spread away outwards manner and are situated on both sides next to the spring leaf, wherein each of the two latching claws includes a retaining lug which is spread away in the direction of the head region and the front of the retaining strip and wherein the retaining lug of each of the latching claws includes a latching edge, and
        a retaining leaf, wherein the retaining leaf starting from the hat region, reaches onto a rear of the retaining strip and from which at least one further retaining lug is cut out and spread away in the direction of the rear of the retaining strip.

2. The contact spring strip according to claim 1, wherein the retaining strip is located on a front plate of a printed circuit board.

3. The contact spring strip according to claim 1, wherein the two latching claws are cut free beyond the bending edge and produce into the hat region.

4. The contact spring strip according to claim 1, wherein the spring leaf has a longitudinal slit.

5. The contact spring strip according to claim 1, wherein the spring leaf together with an approximately roof-shaped cross-section includes a first spring flank extending from a middle of the spring up to a spring end, and a second spring flank extending from the middle of the spring up to the bending edge.

6. The contact spring strip according to claim 1, wherein the retaining lug engages in a latching groove on the rear of the retaining strip.

7. The contact spring strip according to claim 1, wherein the latching edge of the retaining lug of each of the latching claws engages in a latching groove at the front of the retaining strip.

8. The contact spring strip according to claim 1, wherein the spring leaf includes widened portions on both sides of the spring leaf.

9. The contact spring strip according to claim 4, wherein the longitudinal slit reaches beyond the bending edge as far as into the hat region.

10. The contact spring strip according to claim 8, wherein widths of the widened portions correspond approximately to widths of the latching claws.

11. The contact spring strip according to claim 5, wherein the spring leaf includes a longitudinal slit in the second spring flank running into the hat region.

12. The contact spring strip according to claim 11, wherein the longitudinal slit extends beyond the bending edge and into the hat region.

* * * * *